Figure 1:
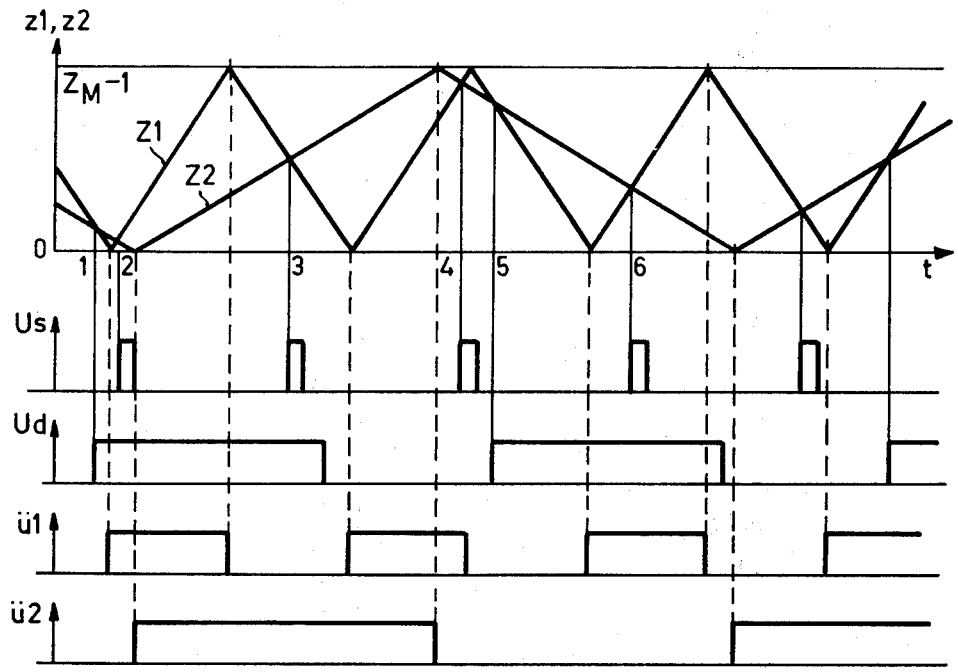

United States Patent [19]
Klinck et al.

[11] 3,982,109
[45] Sept. 21, 1976

[54] CIRCUIT ARRANGEMENT FOR THE FORMATION OF A SUM AND/OR DIFFERENCE SIGNAL

[75] Inventors: Martin Klinck, Uetersen; Udo Mersiowsky, Hamburg, both of Germany

[73] Assignee: U.S. Philips Corporation, New York, N.Y.

[22] Filed: Apr. 7, 1975

[21] Appl. No.: 565,937

[30] Foreign Application Priority Data
Apr. 27, 1974 Germany............................ 2420638

[52] U.S. Cl.............................. 235/150.3; 307/271; 328/14; 328/133
[51] Int. Cl.² ...................... G06F 15/20; H03B 3/04
[58] Field of Search.............. 235/150.3; 307/233 R, 307/271; 328/15, 133; 324/79 D; 328/14

[56] References Cited
UNITED STATES PATENTS

| | | | |
|---|---|---|---|
| 3,448,389 | 6/1969 | Suzuki et al. | 328/133 |
| 3,626,307 | 12/1971 | Koyama | 328/133 |
| 3,644,721 | 2/1972 | Preiser | 235/150.3 |
| 3,657,657 | 4/1972 | Jefferson | 328/14 |
| 3,745,473 | 7/1973 | Klein et al. | 328/133 |
| 3,769,597 | 10/1973 | Mayer | 328/15 X |
| 3,857,103 | 12/1974 | Grazia | 328/133 |

*Primary Examiner*—Jerry Smith
*Attorney, Agent, or Firm*—Frank R. Trifari; Bernard Franzblau

[57] ABSTRACT

In accordance with the triangle method the two input signals whose sum or difference frequencies are to be formed, are compared with each other as triangular signals, and in the case of equality and equal slope a difference pulse and for the opposite direction a sum pulse is formed. The triangular signals, according to the invention, are each produced by a counter, which counters are driven by the input signal or by a signal whose frequency is a corresponding multiple of the input signal frequency. When one of the two final counts of each counter is reached, an associated memory is reset, which reverses the counting direction of said counter and at the same time indicates the direction of the slope of the triangular signal. The counts are compared in parallel in a digital comparator and the output signal of said comparator in conjunction with the final-count or transfer memories of the counters produces the pulses for the corresponding output signal.

12 Claims, 3 Drawing Figures

CIRCUIT ARRANGEMENT FOR THE FORMATION OF A SUM AND/OR DIFFERENCE SIGNAL

The invention relates to a circuit arrangement for the formation of a sum and/or difference signal whose frequency corresponds to the sum or the difference respectively of the frequencies of two input signals, the two input signals being applied to a comparator as symmetrical triangular signals which increase and decrease as a linear function of time. The comparator, in the case of equality of the instantaneous values of the two triangular signals, supplies an output signal. A selection circuit selects and transfers to an output those comparator signals which appear for a corresponding direction of the variation of the values of the triangular signals in the case of the difference signal and for an opposite direction of the variation of the values of the triangular signals in the case of the sum signal.

Such an arrangement is known from U.S. Pat. No. 3,745,473. In said patent the two symmetrical triangular signals, which have the same amplitude, are applied to a differential amplifier with limiter function which operates as a comparator. The two rectangular output signals of the comparator, which are in phase opposition, are each time applied via differentiation elements to two gates. The gates are alternately driven, depending on the direction of the slower triangular signal, so that depending on the phase relationship of the gate drive the frequency of the gate output signals equals the difference or the sum of the frequencies of the two input signals. Said circuit arrangement thus constitutes a pure single-sideband modulator. This principle can be employed for all output signals with the same symmetrical waveform and the same amplitude. In this case of symmetrical triangular signals the pulses of the output pulse trains have the same mutual spacing, i.e. they are equidistantly spaced.

This known triangular method, however, has some drawbacks. The correct operation and the equidistant spacing of the pulses in the output signal are only guaranteed when:

a. the amplitudes of the two signals are exactly the same,
b. the voltage variations are exactly symmetrical and linear,
c. no drift and no shifting of the zero points of the two signals occur, and
d. special steps are taken in the case where the maximum or minimum values of the two signals coincide exactly in time.

When the two input signals have arbitrary waveforms, they should first be converted into symmetrical triangular signals which comply with the requirements mentioned under (a) to (c). This results in a substantial complication as this must be effected independently of the frequency. Moreover, in view of the substantially analog design, an accurate adjustment of the circuit arrangement is in principle necessary before putting it into operation.

It is an object of the invention to provide a circuit arrangement for the formation of a sum and/or difference signal in accordance with the triangle method which mainly employs digital circuit elements and which readily complies with the requirements in respect of linearity and amplitude of the triangular signals. The invention solves this problem in that for the formation of the triangular signals a reversible counter with the same counting capacity for each input signal receives a counting clock pulse train which corresponds to the frequency of said input signal and the counts represent the values of the triangular signals. In addition, a memory each time records the attainment of one of the final values of the counter and the output signal of the memory reverses the counting direction of the counter and represents a direction signal for the direction of the variation of the values of the triangular voltage for driving the selection circuit. Since the counts represent exactly defined values no problems arise with respect to the amplitude of the triangular signals because the final values of the counters are each time the same. The linearity and the symmetry of the triangular signal are naturally guaranteed when the clock pulse trains consist of equidistant pulses.

Effectively, the counting clock pulse trains are formed in accordance with the principle of the phase-locked loop in which for each clock pulse train a voltage controlled oscillator is provided. A phase comparator circuit, in the stationary state, supplies a control voltage, which corresponds to the difference in phase between the corresponding input signal and the output signal of the memory, to the control input of the oscillator and adjusts the frequency of the counting clock pulse train which is produced so that the difference frequency becomes zero. Thus, frequency multiplication is effected, the multiplication factor corresponding to the value of the counting capacity of the counter which is employed for the formation of the triangular signals. The output pulses are spaced equidistantly when a sampling filter is used for obtaining the control voltage of the oscillator. Deriving a pulse signal of high frequency from an input signal with the aid of a phase-locked loop for the formation of a sum or difference signal respectively by means of pulse interlacing is in principle known, yielding a non equidistant pulse train by the direct addition or subtraction of the pulses of two input signals. To improve the equidistant distribution the resultant pulse train is passed through frequency dividers, and to restore the frequency level the input signal must also be transformed into a correspondingly higher frequency. However, said method is very complex, because in addition to the frequency divider in the output circuit for each input signal a corresponding frequency divider must be included in the phase-locked loop. However, in the above embodiment of the invention for the formation of a clock pulse train, there are fewer complications because the counters which are used for the formation of the triangular signal and the transfer signals thereof respectively are also employed for this purpose.

Further embodiments of the invention are described in the sub-claims.

Figure 2:
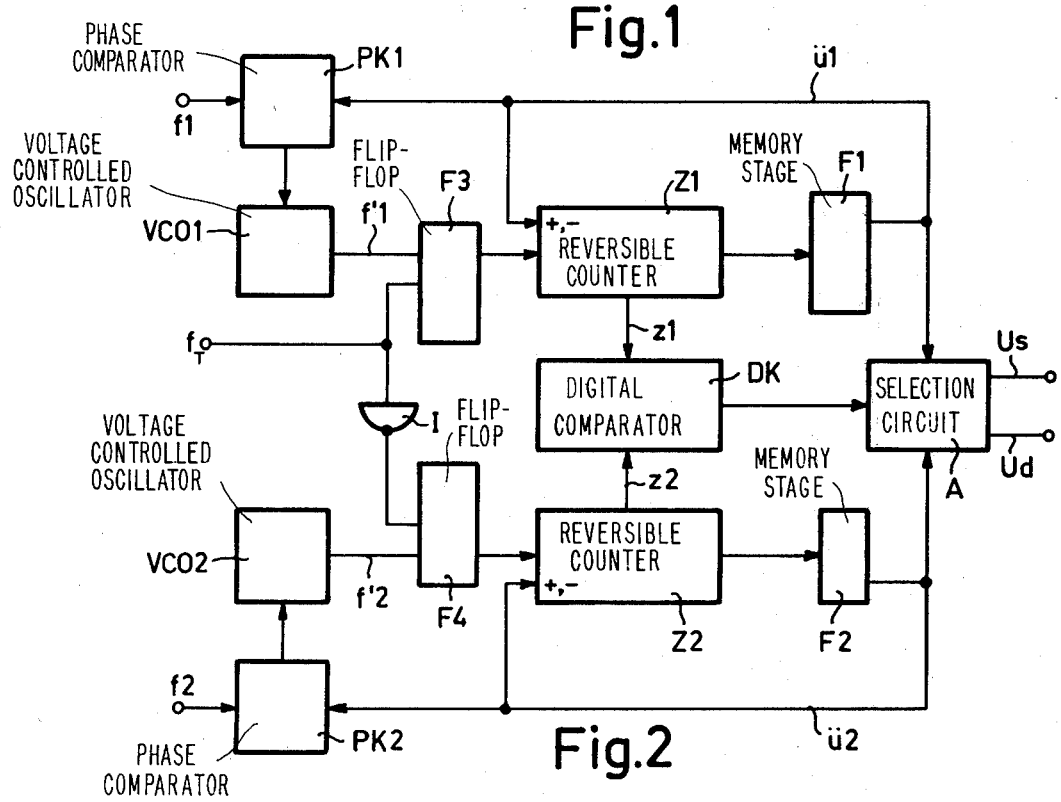
Figure 3:
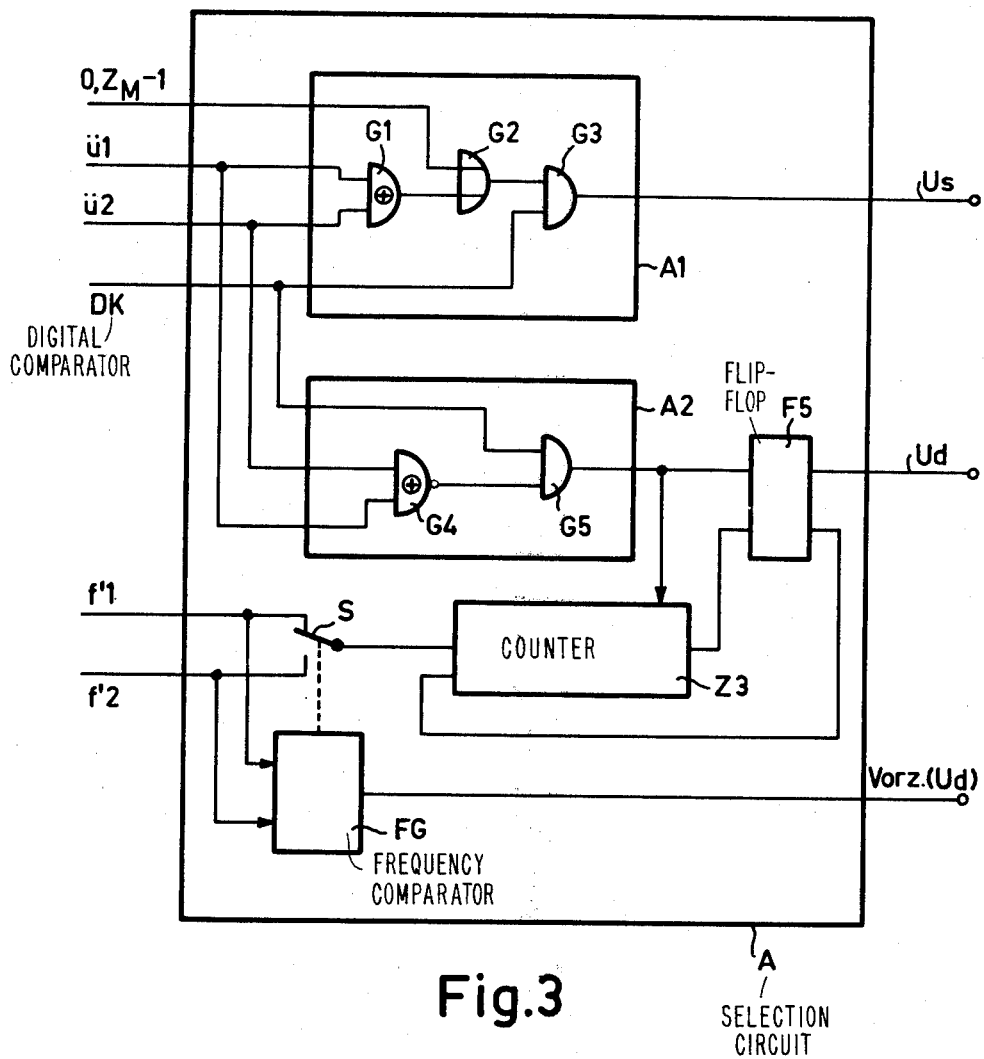

The invention will now be described with reference to the accompanying drawing, in which FIG. 1 is a time diagram in explanation of the triangle method, FIG. 2 shows the block diagram of a circuit arrangement for the formation of a sum and a difference signal, and FIG. 3 shows a more detailed embodiment of the selection circuit.

The principle of the triangle method will first be explained with reference to FIG. 1. In the upper part of said Figure two triangular signals Z1 and Z2 are shown which are assumed to be exactly symmetrical and linear and to have the same amplitude and position. The instantaneous values of these two triangular signals are always the same at their intersections. At the first intersection, which appears at the instant which is denoted by reference numeral 1, the two triangular signals are negative-going so that the direction of the variation of their values is the same, as a result of which a pulse for the difference signal $U_d$ is formed. The following intersection at the instant 2 is obtained for opposite directions of the triangular signals. The signal Z2 is then still negative-going, while the signal Z1 is already positive-going. Said intersection thus results in a pulse for the sum signal $U_s$. At the instants 3 and 4 the two triangular signals also intersect each other with an oppositely directed slope so that in each of these cases a pulse for the sum signal $U_s$ is produced. It is not until the instant 5 that the two triangular signals intersect again with the same direction of slope, so that a pulse is produced for the difference signal $U_d$. At the intersection at the instant 6 the two triangular signals again have opposite slopes, so that a pulse for the sum signal $U_s$ is formed, etc. A simple calculation reveals that the frequencies of the obtaining pulse trains exactly equal the sum and the difference respectively of the frequencies of the two input signals and that the pulses therein are exactly equidistant when the triangular signals Z1 and Z2 exactly comply with the requirements mentioned in the preamble.

Such triangular signals are formed with the aid of counters, the counts $z1$ and $z2$ representing the values of the triangular signals. In the block diagram of FIG. 2 said counts are formed by the counters Z1 and Z2. Via flip-flops F3 and F4 said counters are driven by a counting clock pulse train $f'_1$ and $f'_2$ respectively, whose frequency corresponds to the frequency $f_1$ and $f_2$ respectively of the relevant input signal and is an integral multiple thereof. When the frequency level of the sum signal $U_s$ and of the difference signal $U_d$ must equal the frequency level of the input signals, said multiple should exactly equal the capacity $2.(Z_M-1)$ of the counters Z1 and Z2. The formation of said counting clock pulse trains $f'_1$ and $f'_2$ will be described hereinafter.

Now it is assumed that the counter Z1 counts up with the counting capacity $Z_M$. Once it has reached its maximum count $Z_M-1$, it produces a signal for the memory stage F1 at its right-hand output, which stage as a result of this signal changes its output signal $u_1$ to the other state, as is shown in FIG. 1. At the same time the counting direction of the counter Z1 is also reversed from + to − via its direction input so that the subsequent counting clock pulse trains cause the counter to count down to zero. Upon reaching the zero position the counter Z1 again produces a signal for the memory stage F1 at its right-hand output, which stage then resets its output $u1$ to the previous state, as is shown in FIG. 1. Simultaneously, the counting direction of the counter Z1 is reversed so that the counter counts up again. Thus, the triangular variation in time of the count $z1$ is obtained. In a similar manner, but with a correspondingly different frequency, this process is also performed for the counter Z2 and the memory stage F2, as well as the output signal u2 thereof.

The counts $z1$ and $z2$, i.e. the parallel output signals of the counters Z1 and Z2, are applied to a digital comparator DK, which compares the counts and supplies an output signal to the selection circuit A when all counter outputs are in accordance with each other, in pairs. Said selection circuit in accordance with the combination of the signal $u1$ u1 and $u2$, supplies the signals to one of the two outputs Us or Ud. As appears from FIG. 1, a signal is produced at the output for the sum signal $U_s$ when the two condition signals $u1$ and $u2$ are opposed, whereas a signal is produced at the output for the difference signal $U_d$ when the two condition signals $u1$ and $u2$ are the same.

It is evident that the variations of the counts represented in FIG. 1 are not continuous but stepwise on account of the discrete operation of the counters. The relative height of the steps then depends directly on the capacity $Z_M$ of the counters Z1 and Z2. In determing the intersections of the count variations, i.e. the comparison of the counts with the aid of the digital comparator DK, this causes an error in the pulse spacings of the output signals of the digital comparator, which in the most unfavourable case corresponds to the value of half the relative step height when the one edge of each of the output signals is measured.

On account of the step character of the count variations specific special situations may arise. When the counts $z1$ and $z2$ differ exactly one count in the case of opposite counting directions of the counters Z1 and Z2 and the clock pulse trains $f'_1$ and $f'_2$ arrive exactly at the same time, the counts will be interchanged without the intermediate occurrence of an equality of counts, so that the digital comparator DK would erroneously fail to supply an output signal. In the block diagram of FIG. 2 this is prevented in that the two counting clock pulse trains $f'_1$ and $f'_2$ are synchronized with a clock signal $f_T$ in such a way that the counting signals which drive the counters Z1 and Z2 are always offset relative to each other. This is effected with the aid of the flip-flops F3 and F4. The flip-flop F3 receives the counting pulse train $f'_1$ at its conditioning input and the clock signal $f_T$ at its trigger input, and its output drives the counter Z1 with the next edge of the clock signal which occurs after the beginning of a counting clock pulse. The flip-flop F4 also receives a corresponding counting clock pulse train $f'_2$ at the conditioning input and the clock signal via the inverter I, i.e. the inverse clock signal at the trigger input, and thus drives the counter Z2 with the next rear edge of the clock pulse which appears after the beginning of a counting clock pulse train. The smallest pulse width of the output signal of the digital comparator therefore equals a half period of the clock signal $f_T$ and the largest pulse width of said output signal exceeds said smallest width by the smaller value of the periods of the two clock pulse trains $f'_1$ and $f'_2$.

Accordingly, equality of the counts can occur during several counting pulse trains for the same slope of the count variations, especially when the input frequencies and thus the slopes are approximately equal. The one counter then leads for several counting steps, the other counter then catches up upon the next counting clock pulse train of said counter. In this case the digital comparator supplies several output pulses after each other, although only one signal should be produced for the difference signal $U_d$. Allowance is made for this in the selection circuit A, which is shown in greater detail in FIG. 3.

There, the upper unit A1 supplies the pulses for the sum signal $U_s$, as will be explained hereinafter. The lower unit A2 produces pulses from which the difference signal is obtained. This lower unit A2 comprises an exclusive or-gate G4 whose output includes an inverter, as is indicated by the circle near the output connection. As a result, the gate G4 supplies a signal each time that the two signals $u1$ and $u2$ are equal, i.e. when the slopes of the two triangular signals in FIG. 1 have the same direction. When equality of the two counts is attained, the digital comparator DK supplies a signal and said signal appears at the output of unit A2 via the enabled and-gate G5. This signal not only sets the flip-flop F5 and thus produces a signal at the output for the difference signal $U_d$, but it also resets the counter Z3 to its initial value. As flip-flop F5 is now set, the counting input of the counter Z3 is now enabled. A frequency comparator FG receives the two synchronized counting clock pulse trains $f'_1$ and $f'_2$ and activates the switch S so that the counting clock pulse train with the highest frequency is each time transferred to the counting input of the counter Z3. Said counter is now started, but is reset upon each output signal from the unit A2 until there is no longer an equality of counts. When the counter Z3 has counted to its final count, it resets the flip-flop F5 and thus discontinues the output pulse of the difference signal $U_d$.

The capacity of the counter Z3 must be at least 2, i.e. it must be capable of two pulses of the counting clock pulse train with the highest frequency. The associated counter Z1 or Z2 then leads the relevant other counter by two steps and the other counter can no longer catch up with it. However, this applies only to ideally synchronized counting clock pulse trains which are absolutely equidistant. In practice, however, certain statistical fluctuations will occur because the counting clock pulse trains are not correlated to the clock signal $f_T$ before the synchronizing stages F3 and F4. Furthermore, depending on the method of generating the counting clock pulse trains, these may not be precisely equidistant themselves. For this reason it is effective not to use the minimum counting capacity for the counter Z3, which can already be attained with a single flip-flop, but to select a higher capacity. The maximum counting capacity can be found when the one input signal has the frequency zero, i.e. that the relevant counter Z1 or Z2 produces a constant output signal. Equality of the counters then occurs only once for an intersection and when the next intersection is reached, which then occurs at the same count and thus after a complete counting cycle of the corresponding counter, the counter Z3 should already have reached its final count. It follows that the maximum capacity of the counter Z3 is $2(Z_M-1)-1 = 2.Z_M-3$, where $Z_M$ is the capacity of each of the counters Z1 and Z2.

The frequency comparator FG may also be employed to indicate the sign of the frequency of the difference signal $U_d$, when it is for example assumed that for a positive difference frequency the counting clock pulse train $f'_1$ has the higher frequency.

The unit A1 is designed in a similar manner to the unit A2. The two signals $u1$ and $u2$ are now applied to an exclusive or-gate circuit G1 without output inversion, which circuit consequently supplies an output signal when the two signals are different. This output signal is applied via the or-circuit G2 to the and-circuit G3, which in the case of receipt of an output signal from the digital comparator DK produces a pulse for the sum signal $U_s$. Furthermore, the or-circuit G2 receives an input signal as a result of the two final counts of one of the counters. When the two counters reach a final value in the same direction, i.e. when the intersection is for example at the maximum value, a pulse must be produced for both output signals. As each counter upon reaching the one final value reverses the transfer signal $u1$ or $u2$, there will only be coincidence of the counts in the case of equal transfer signals. Hence, additional steps must be taken for the formation of the pulse in the sum signal $U_s$, which steps in the present instance are represented by the or-gate G2.

So far, it was assumed that the counting clock pulse trains $f'_1$ and $f'_2$ were already available with the correct frequency. The output signals $U_s$ and $U_d$ are then reduced by the factor $2(Z_m-1)$ relative to said counting clock pulse trains. When the input frequencies with correspondingly higher values are directly available, this circuit arrangement would be suited for use without any further steps. However, if this is not the case frequency multiplication of the input signals $f_1$ and $f_2$ is necessary. In the circuit arrangement of FIG. 2 this is achieved with the aid of the voltage-controlled oscillators VCO1 and VCO2, which are driven by the phase comparators PK1 and PK2, respectively. These phase comparators compare the input frequency $f_1$ and $f_2$ with the corresponding transfer signal $u1$ and $u2$, respectively, so that the period of the triangular signal equals the period of the corresponding input frequency. In this case, depending on the selected filter in the phase comparator PK1 or PK2, additional errors in the equidistant distribution of the pulses of the counting clock pulse trains $f'_1$ and $f'_2$ may occur, because these may exhibit a frequency modulation so that the count variations may also be modulated correspondingly. This is avoided when, in the phase comparison stages, sampling filters are used whose output signal is constant during a comparison period and corresponds to the pulse ratio of the phase comparison signal in the preceding period. A modification of this circuit arrangement can be obtained in that a counter is replaced by a parallel supply of a digital value, so that it is then possible to produce an output pulse train whose phase is shifted frequency-independently relative to the input pulse train and whose phase relation is determined by the applied number.

What is claimed is:
1. A circuit for the formation of a sum and difference signal whose frequencies correspond to the sum and the difference frequencies respectively of the frequencies of first and second input signals, comprising means for applying the two input signals to a comparator means as symmetrical triangular signals whose amplitude values increase and decrease as a linear function of time, said comparator means producing an output signal upon equality of the instantaneous values of the two triangular signals applied thereto, a selection circuit coupled to the output of the comparator means and responsive to said output signal, said selection circuit having output means for supplying said difference signal for a corresponding direction of the variation of the values of the triangular signals and said sum signal for an opposite direction of the variation of the values of the triangular signals, means for the formation of the triangular signals including first and second reversible counters each having the same counting capacity ($Z_M$) for each input signal received, means for applying to the inputs of said first and second counters first and second counting clock pulse trains respectively, which correspond to the frequency of said first and second input signals so that the counts represent the amplitude values of the triangular signals, first and second memory devices coupled to said first and second counters, respectively, and responsive to the at- tainment of the final count values of the respective counters to derive an output signal which reverses the counting direction of the relevant counter and represents a direction signal for the direction of the variation of the amplitude values of the triangular voltage, and means for driving the selection circuit with the output signals of the memory devices.

2. A circuit for combining first and second input signals to produce an output signal whose frequency corresponds to the sum or difference frequency of the frequencies of said input signals comprising, first and second reversible counters each having the same counting capacity $Z_M$, means for applying to the inputs of said first and second counters first and second trains of counting clock pulses, respectively, having first and second frequencies related to the frequencies of said first and second input signals, respectively, first and second memory devices coupled to said first and second counters, respectively, and each responsive to the final count values of its respective counter to derive first and second direction signals, a selection circuit having output means at which said output signal appears, comparator means with its input coupled to said first and second counters and with its output coupled to the input of the selection circuit, means coupling the outputs of said first and second memory devices to said selection circuit and to respective direction control inputs of said first and second counters whereby said counters count up and down in response to said counting clock pulses to produce first and second symmetrical triangular signals whose amplitude values increase and decrease as a linear function of time and the instantaneous count in each counter represents the instantaneous amplitude value of the respective triangular signal, said comparator means being responsive to equality of the counts in the first and second counters to supply a control signal to the selection circuit, said selection circuit being responsive to said control signal and to the direction signals at the outputs of said first and second memory devices to derive at its output means a difference output signal when the slopes of said first and second symmetrical triangular signals have the same sign and a sum output signal when the slopes of said first and second symmetrical triangular signals are of opposite sign.

3. A circuit as claimed in claim 2 further comprising means for producing said first and second counting clock pulse trains which comprises, first and second voltage-controlled oscillators, first and second phase comparators each having first and second inputs for receiving said first and second input signals and the corresponding output signals of the respective first and second memory devices thereby to supply first and second control voltages to respective control inputs of said first and second oscillators, each oscillator being responsive thereto to adjust its frequency to derive at its respective output said first and second counting clock pulse trains, the frequency of the output pulses produced by said oscillators being varied until the frequency difference of the signals at the first and second inputs of their respective phase comparators becomes equal to zero.

4. A circuit as claimed in claim 3 wherein each phase comparator includes a sampling filter which produces the control voltage for its respective oscillator in such a way that said control voltage is constant each time during a clock period and corresponds to the difference in phase of the preceding period.

5. A circuit as claimed in claim 2 further comprising a synchronizing stage controlled by a clock signal for converting the first and second counting clock pulse trains into first and second counter stepping signals which are mutually shifted in time for driving the first and second counters.

6. A circuit as claimed in claim 2 wherein the comparator means comprises a digital comparator with a number of inputs corresponding to the counting capacity ($Z_M$) of the counters.

7. A circuit as claimed in claim 2 wherein, for the sum signal, the selection circuit includes means for selecting the output signal of the comparator means independently of the direction signals from the first and second memory devices in the case of equality of the values at one of the final counts of the first and second counters.

8. A circuit as claimed in claim 2 wherein the selection circuit comprises, a memory stage for the difference signal, each output signal of the selection circuit setting the memory stage for the difference signal, a third counter having a maximum counting capacity equal to double the counting capacity ($Z_M$) minus three of the first and second counters, means responsive to the output signal of the memory stage for causing the transfer of the counting clock pulse train with the higher frequency to said third counter, each of said output signals of the memory stage being coupled to reset the third counter to the initial state, the third counter in its final count position supplying a transfer signal which resets the memory stage.

9. A circuit as claimed in claim 8 wherein the selection circuit further comprises, a frequency comparator circuit which receives the first and second counting clock pulse trains and transfers the counting clock pulse train with the higher frequency to the counting input of the third counter and independently of which of the two inputs of the frequency comparator circuit the counting clock pulse train with the higher frequency occurs, said frequency comparator circuit producing a signal which represents the sign of the frequency of the difference signal produced at the output of the memory stage.

10. A circuit as claimed in claim 2 characterized in that a reversible counter is replaced by a digital data input with a corresponding number of digits.

11. A circuit as claimed in claim 2 wherein said selection circuit output means comprises first and second output terminals at which pulse-type output signals of the respective sum and difference frequencies of the two input signals are produced.

12. A circuit as claimed in claim 2 wherein said memory devices each comprise a bistable circuit, said circuit further comprising synchronizing means for relatively shifting in time the counting clock pulses applied to the inputs of said first and second counters which comprises, first and second bistable devices, a source of clock pulses coupled directly to a first input of one of said first and second bistable devices and via an inverter to a first input of the other one of said first and second bistable devices, means for applying said first and second trains of counting clock pulses to a second input of said first and second bistable devices, respectively, and means for coupling the outputs of the first and second bistable devices to the inputs of the first and second counters, respectively.

* * * * *